(12) United States Patent
Lin et al.

(10) Patent No.: US 9,178,295 B1
(45) Date of Patent: Nov. 3, 2015

(54) FLEXIBLE PRINTED CIRCUIT BOARD HAVING GOLD FINGERS

(71) Applicant: DELTA ELECTRONICS, INC., Taoyuan County (TW)

(72) Inventors: Yu-Liang Lin, Taoyuan County (TW); Wen-Ping Teng, Taoyuan County (TW); Jie Li, Taoyuan County (TW); Guang Yang, Taoyuan County (TW); Wen-Yi Chien, Taoyuan County (TW)

(73) Assignee: DELTA ELECTRONICS, INC. (TW)

( * ) Notice: Subject to any disclaimer, the term of this patent is extended or adjusted under 35 U.S.C. 154(b) by 0 days.

(21) Appl. No.: 14/515,209

(22) Filed: Oct. 15, 2014

(30) Foreign Application Priority Data

Aug. 18, 2014 (CN) .......................... 2014 1 0406090

(51) Int. Cl.
| | |
|---|---|
| *H01R 12/62* | (2011.01) |
| *H01R 12/51* | (2011.01) |
| *H05K 1/11* | (2006.01) |
| *H05K 1/03* | (2006.01) |
| *H05K 1/02* | (2006.01) |
| *H05K 1/09* | (2006.01) |

(52) U.S. Cl.
CPC ............... *H01R 12/62* (2013.01); *H01R 12/51* (2013.01); *H05K 1/0298* (2013.01); *H05K 1/0326* (2013.01); *H05K 1/0346* (2013.01); *H05K 1/09* (2013.01); *H05K 1/115* (2013.01); *H05K 2201/0154* (2013.01); *H05K 2201/05* (2013.01)

(58) Field of Classification Search
CPC ....................................................... H01R 12/62
See application file for complete search history.

(56) References Cited

U.S. PATENT DOCUMENTS

| | | | | |
|---|---|---|---|---|
| 4,113,981 | A | * | 9/1978 | Fujita et al. ................. 174/88 R |
| 4,846,709 | A | * | 7/1989 | Kobayashi et al. ........... 439/161 |
| 4,894,015 | A | * | 1/1990 | Stockero et al. ................ 439/67 |
| 5,194,010 | A | * | 3/1993 | Dambach et al. .............. 439/79 |
| 5,205,750 | A | * | 4/1993 | Darrow et al. ................ 439/77 |
| 5,730,619 | A | * | 3/1998 | Hamlin ......................... 439/493 |
| 5,920,465 | A | * | 7/1999 | Tanaka ......................... 361/784 |
| 6,055,722 | A | * | 5/2000 | Tighe et al. ..................... 29/843 |
| 2007/0190847 | A1 | * | 8/2007 | Ichino et al. ................. 439/495 |
| 2008/0139011 | A1 | * | 6/2008 | Uka ................................ 439/65 |
| 2008/0158181 | A1 | * | 7/2008 | Hamblin et al. .............. 345/173 |
| 2009/0088007 | A1 | * | 4/2009 | Tsai .............................. 439/67 |
| 2014/0049671 | A1 | * | 2/2014 | Chen ............................ 348/294 |

* cited by examiner

*Primary Examiner* — James Harvey
(74) *Attorney, Agent, or Firm* — Hauptman Ham, LLP

(57) ABSTRACT

The present invention provides a flexible printed circuit board having gold fingers, comprising a base sheet, a metallic layer and a protective sheet. The base sheet has a plurality of voids thereon. The metallic layer is provided on the base sheet, and has at least one plated through hole. The protective sheet is provided on the base sheet and the metallic layer to expose a portion of the metallic layer and the plated through hole. The flexible printed circuit board may electrically be connected to a conductive terminal of a rigid printed circuit board with one gold finger and electrically be connected to a system with another gold finger. The plated through hole has a function of heat conduction and soldering, and the voids of the flexible printed circuit board can provide a space for overflowing solder and heat dissipation.

13 Claims, 6 Drawing Sheets

FLEXIBLE PRINTED CIRCUIT BOARD HAVING GOLD FINGERS

BACKGROUND OF THE INVENTION

1. Field of the Invention

The invention relates to a flexible printed circuit board, and in particular to electrical connection between a flexible printed circuit board and a rigid printed circuit board or a rigid printed wire board.

2. Brief Description of the Related Art

A traditional notebook computer has a small fan inside. The small fan can dissipate the heat produced by electronic components on a mother board in the notebook computer to outside of the housing so that the electronic components on the mother board can work smoothly.

At present, the small fan is provided with a rigid printed circuit board on the bottom of a base. The rigid printed circuit board has a control circuit or driving circuit. The rigid printed circuit board is connected to a transmission line set consisting of a plurality of cables. The transmission line set is electrically connected to the mother board of the notebook computer so that the fan can be controlled by the mother board. Because the cable has a thickness about 0.38 mm, it would occupy much space of the base of the small fan and the height of the small fan may be not reduced. Accordingly, the small fan electrically connecting to the cables is not suitable for a slim type notebook computer.

More recently, a notebook computer that has a small fan using one flexible printed circuit board and a transmission line set using another flexible printed circuit board is proposed so that it can save much more space to achieve a slim type system. However, it would increase the cost of manufacture. Therefore, there is a need to develop a small fan with a transmission line set which has a low cost of manufacture and reduce a thickness of the small fan.

SUMMARY OF THE INVENTION

It is an object of the invention to provide a flexible printed circuit board having a gold finger for connecting with a rigid printed circuit board. The flexible printed circuit board is used as a transmission interface that can not only reduce the cost of manufacture, but also save space.

To achieve the above object, the present invention provides a flexible printed circuit board connecting electrically with a conductive terminal of a rigid printed circuit board and connecting electrically with a terminal of a system. The flexible printed circuit board comprises a base sheet, a metallic layer and a protective sheet.

The base sheet has a first surface and a second surface thereon, and the base sheet has a first end and a second end. The metallic layer comprises a first metallic layer and a second metallic layer shorter than the first metallic layer. The first metallic layer may be provided on the second surface or the first surface of the base sheet. The first metallic layer has a first electrical connecting portion for electrically connecting to the terminal of the system that is provided on the second surface or the first surface at the first end in one end, and the first metallic layer has a second electrical connecting portion for electrically connecting to the conductive terminal of the rigid printed circuit board or a rigid printed wire board on the second surface or the first surface at the second end in another end. The second electrical connecting portion has at least one first plated through hole.

The second metallic layer may be provided on the first surface or the second surface of the base sheet at the second end. The second metallic layer has a third electrical connecting portion and a fourth electrical connecting portion. The second metallic layer has at least one second plated through hole between the third electrical connecting portion and the fourth electrical connecting portion. The second plated through hole may communicate with the first plated through hole. The first plated through hole is formed a plating layer on an internal wall. The second plated through hole is formed a plating layer on an internal wall.

The protective sheet is provided on the metallic layer and the base sheet to expose the first electrical connecting portion of the first end, the second electrical connecting portion of the second end, first plated through hole, the third electrically connecting portion and the second plated through hole.

In an aspect, a width of the second end is greater than or equal to that of the first end. The base sheet has a meandering shape, straight line shape or curved shape. The base sheet is a material of polyimide. The second end has a plurality of voids. A connecting portion is provided on one side of the voids.

The first metallic layer comprises a plurality of wires, and the second metallic layer comprises a plurality of wires. The wires of the first metallic layer at the second end are separated by the voids and the wires of the second metallic layer at the second end are separated by the voids. The first plated through hole and the second plated through hole which are provided on one of the wires are symmetric or asymmetric with the first plated through hole and the second plated through hole which are provided on another adjacent wire. The metallic layer is a copper foil. The first plated through hole and the second plated through hole are filled with a solder.

The protective sheet comprises a first protective sheet and a second protective sheet. The first protective sheet is provided on the first metallic layer and the base sheet. The first protective sheet may expose the first electrical connecting portion, the second electrical connecting portion and first plated through hole. The second protective sheet is provided on the second metallic layer and the base sheet to expose the third electrically connecting portion and the second plated through hole. The second protective sheet has a plugging sheet at one end to match with the first electrical connecting portion so that the plugging sheet and the first electrical connecting portion can plug to the terminal of the system. The protective sheet is a material of epoxy.

DETAILED DESCRIPTION OF THE INVENTION

Other objects and advantages of the present invention will become apparent from the detailed description to follow taken in conjunction with the appended claim.

Figure 1:
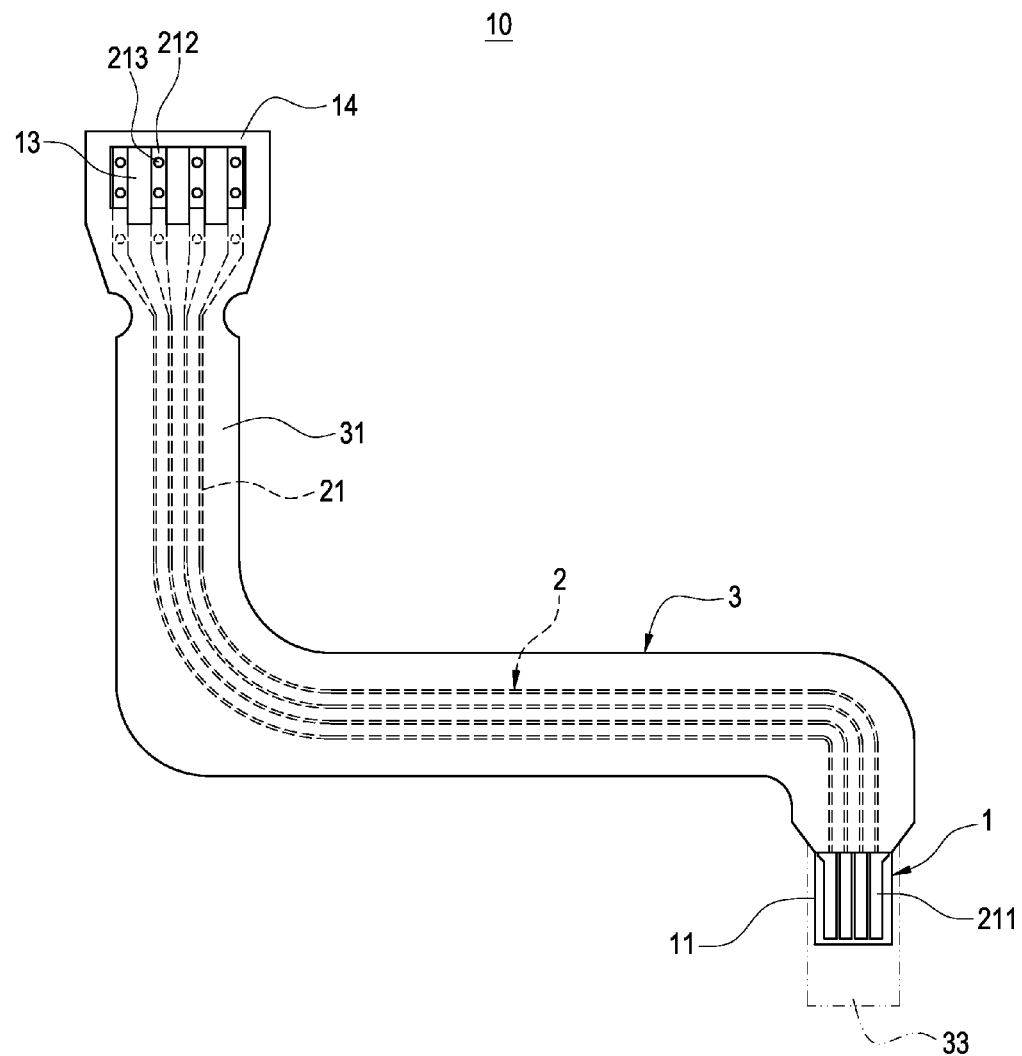
FIG. 1 shows a front view of a flexible printed circuit board of an embodiment according to the invention.
Figure 2:
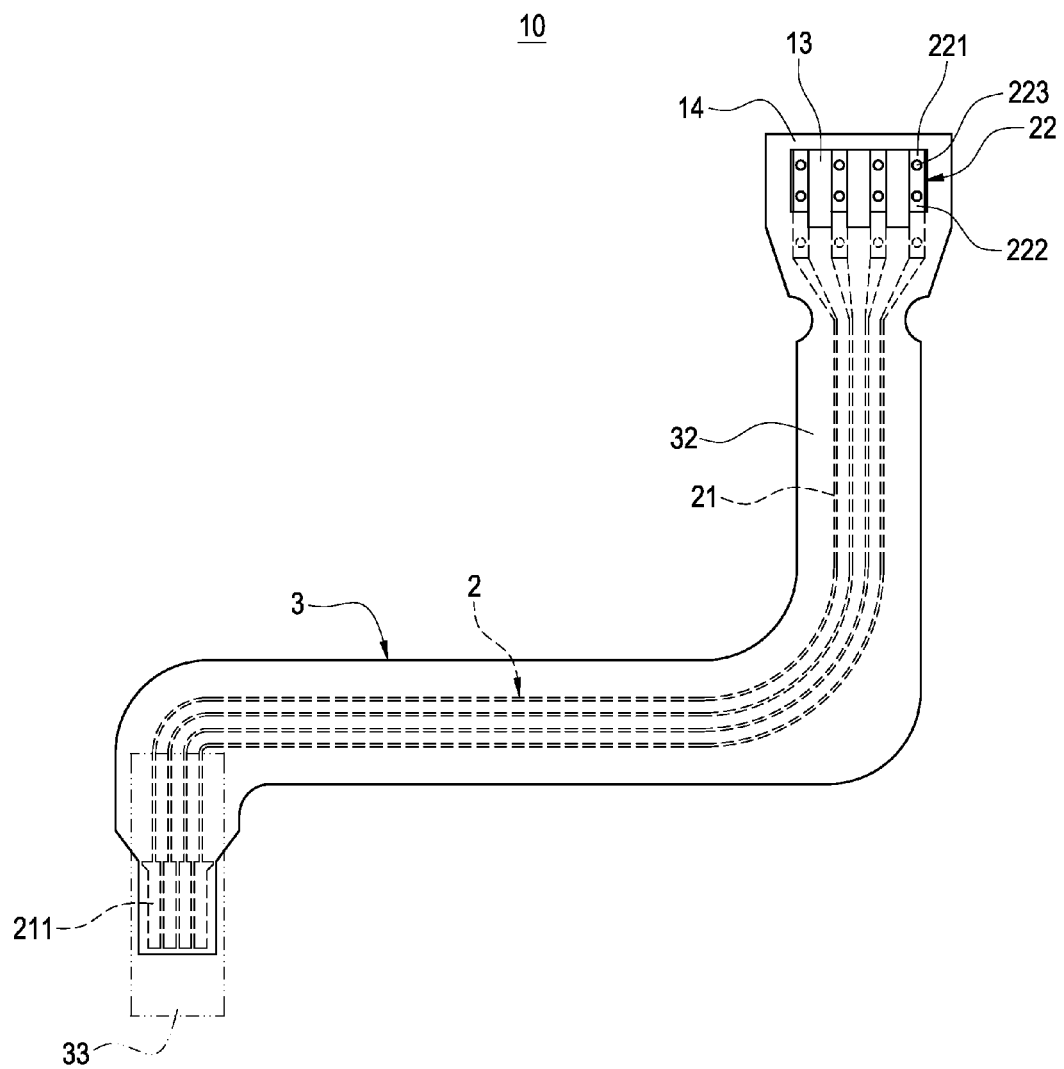
FIG. 2 shows a rear view of a flexible printed circuit board of an embodiment according to the invention.
Figure 3:
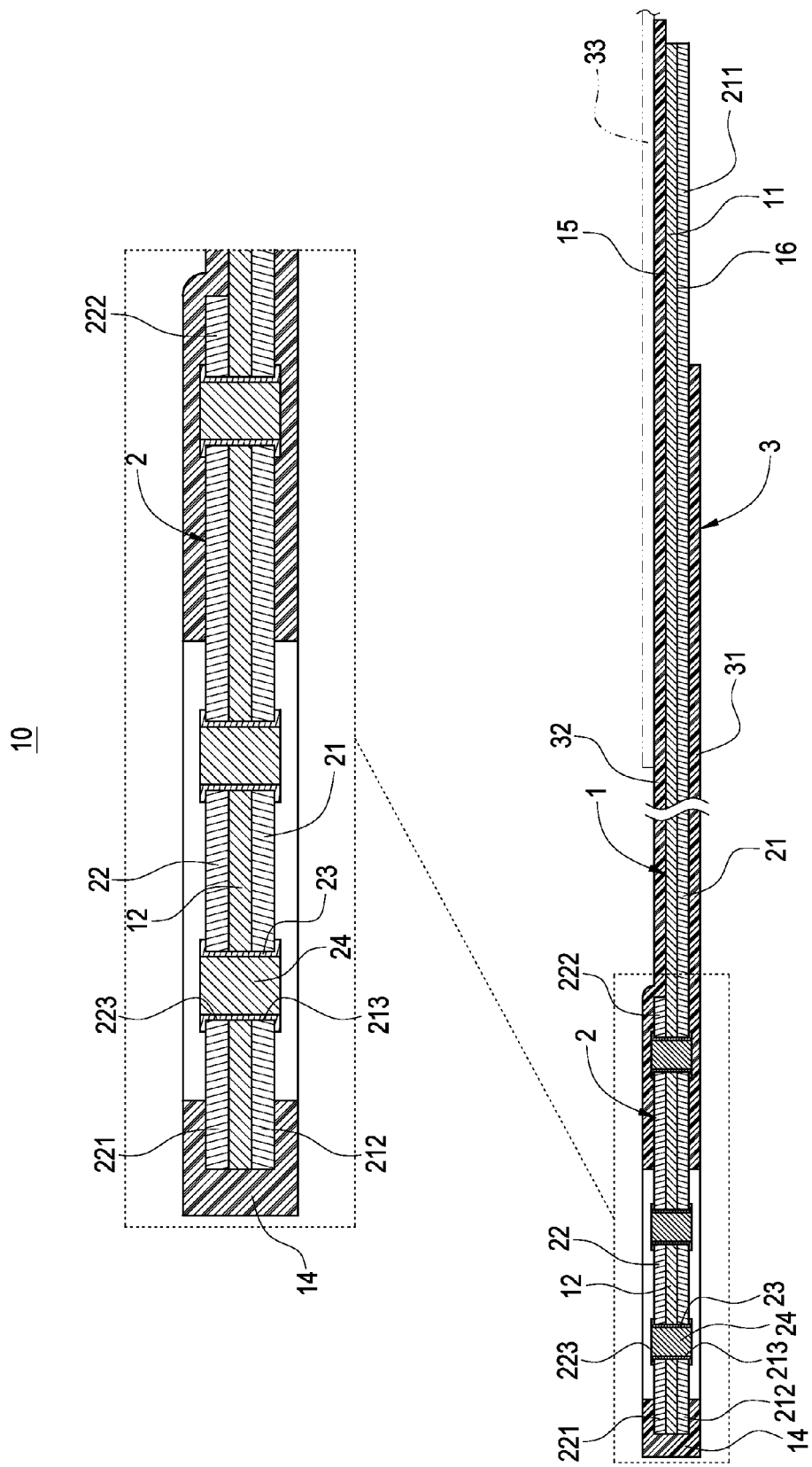
FIG. 3 shows a side sectional view of a flexible printed circuit board of an embodiment according to the invention.

Please refer to FIGS. 1 to 3. FIGS. 1 to 3 show a front view, a rear view and a side sectional view of a flexible printed circuit board of an embodiment according to the invention. In an embodiment, a flexible printed circuit board 10 having gold fingers comprises a base sheet 1, a metallic layer 2 and a protective sheet 3.

The base sheet 1 has a first end 11 and a second end 12. The base sheet 1 has a first surface 15 and a second surface 16. A width of the second end 12 is greater than or equal to that of the first end 11. The second end 12 has a plurality of voids 13. A connecting portion 14 is provided on one side of the voids. In the embodiment, the base sheet 1 is a material of polyimide, and has a meandering shape, straight line shape or curved shape.

The metallic layer 2 comprises a first metallic layer 21 and a second metallic layer 22 shorter than the first metallic layer 21. The first metallic layer 21 may be provided on the second surface 16 or the first surface 15 of the base sheet 1. The first metallic layer 21 has a first electrical connecting portion 211 for inserting in a terminal of a system (not shown in FIGS) on the second surface 16 or the first surface 15 at the first end 11 in one end, and the first metallic layer 21 has a second electrical connecting portion 212 for electrically connecting to a rigid printed circuit board or a rigid printed wire board (not shown in FIGS) on the second surface 16 or the first surface 15 at the second end 12 in another end. Also, the second electrical connecting portion 212 has at least one first plated through hole 213.

The second metallic layer 22 may be provided on the first surface 15 or the second surface 16 of the base sheet 1 at the second end 12. The second metallic layer 22 has a third electrical connecting portion 221 and a fourth electrical connecting portion 222. The second metallic layer 22 has at least one second plated through hole 223 between the third electrical connecting portion 221 and the fourth electrical connecting portion 222. The second plated through hole 223 may communicate with the first plated through hole 213. The first plated through hole 213 is formed a plating layer 23 on an internal wall. The second plated through hole 223 is formed a plating layer 23 on an internal wall. The first plated through hole 213 and the second plated through hole 223 may be filled with a solder 24 to conduct the first metallic layer 21 and the second metallic layer 22.

In the embodiment, the first metallic layer 21 comprises a plurality of wires, and the second metallic layer 22 comprises a plurality of wires. The wires of the first metallic layer 21 are separated by voids 13 and the wires of the second metallic layer 22 are separated by voids 13. The first plated through hole 213 and the second plated through hole 223 which are provided on one of the wires are symmetric or a symmetric with the first plated through hole 213 and the second plated through hole 223 which are provided on another adjacent wire. Also, the metallic layer 2 is a copper foil.

The protective sheet 3 comprises a first protective sheet 31 and a second protective sheet 32. The first protective sheet 31 is provided on the first metallic layer 21 and the base sheet 1. The first protective sheet 31 may expose the first electrical connecting portion 211, the second electrical connecting portion 212 and first plated through hole 213. The second protective sheet 32 is provided on the second metallic layer 22 and the base sheet 1 to expose the third electrically connecting portion 221 and the second plated through hole 223. In addition, the second protective sheet 32 has a plugging sheet 33 at one end to match with the first electrical connecting portion 211 so that the plugging sheet 33 and the first electrical connecting portion 211 can plug to the terminal of the system. In the embodiment, the protective sheet 3 is a material of epoxy.

Figure 4:
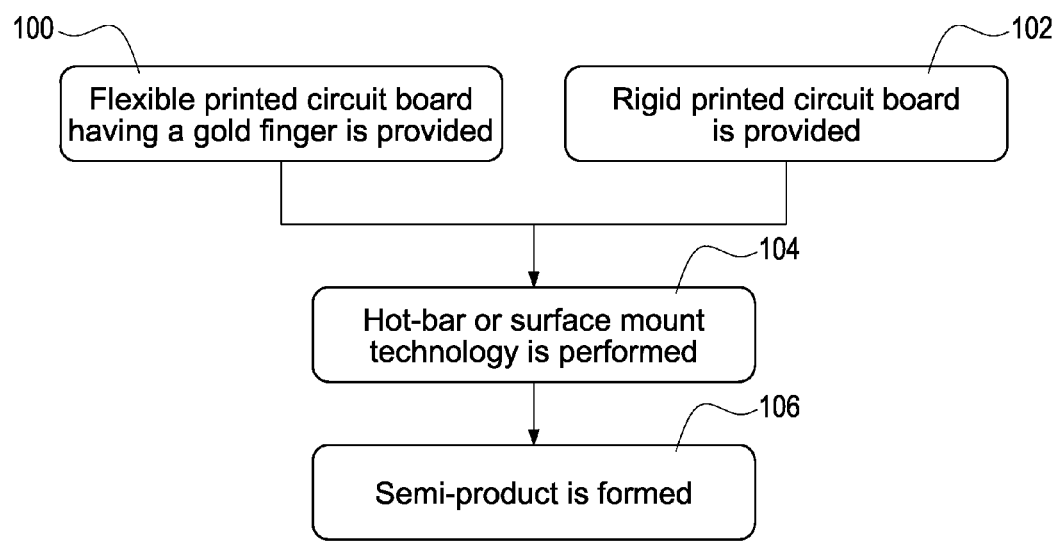
FIG. 4 shows a flow chart of process for connecting a flexible printed circuit board having a gold finger with a rigid printed circuit board of an embodiment according to the invention.
Figure 5:
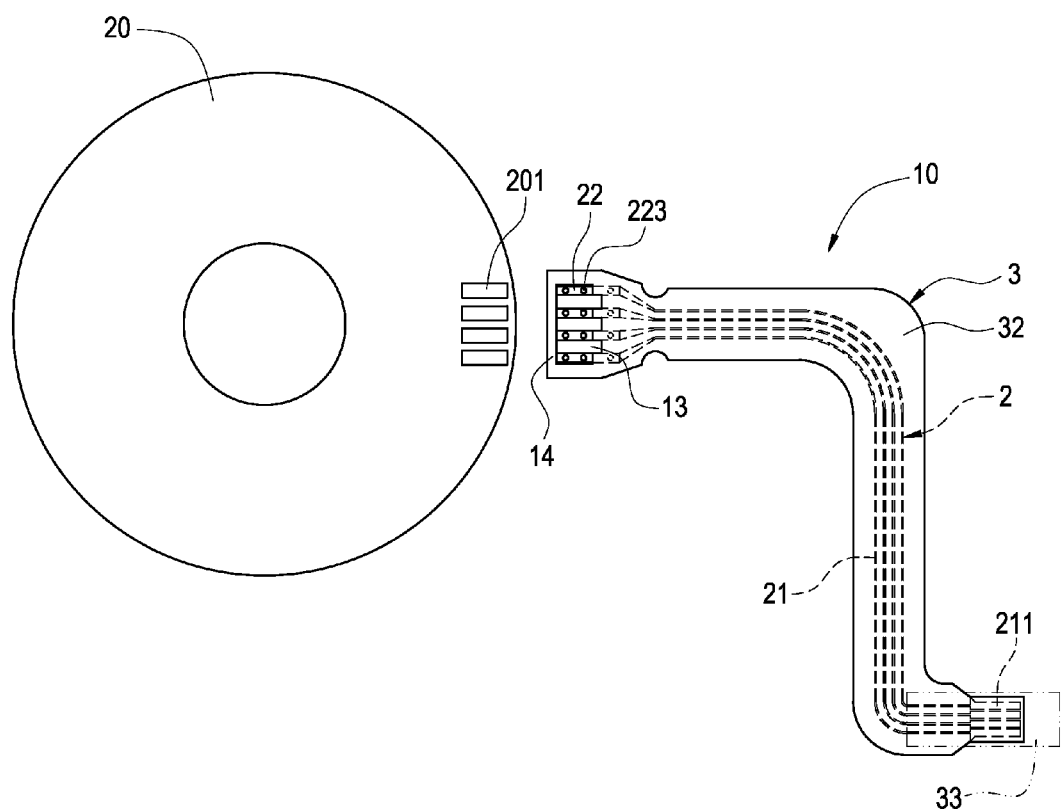
FIG. 5 shows a disassemble state of a flexible printed circuit board having a gold finger with a rigid printed circuit board.
Figure 6:
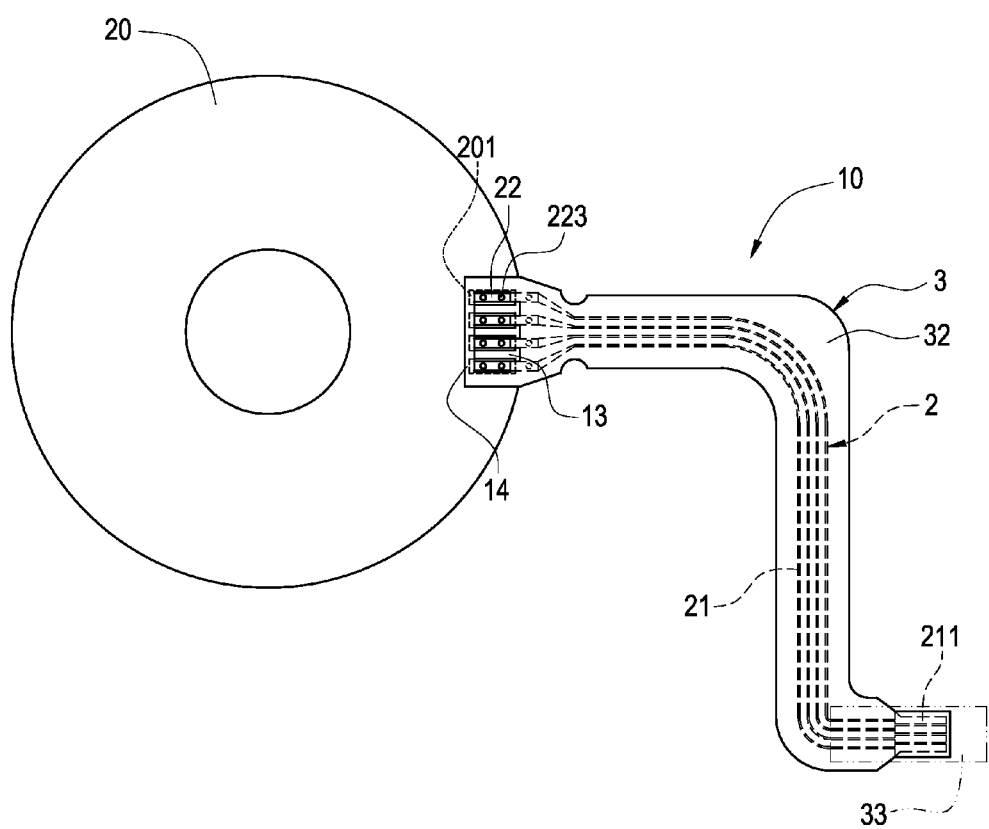
FIG. 6 shows an assemble state of a flexible printed circuit board having a gold finger with a rigid printed circuit board.

Please refer to FIGS. 4 to 6. FIG. 4 shows a flow chart of process for connecting a flexible printed circuit board having a gold finger with a rigid printed circuit board of an embodiment according to the invention. FIGS. 5 and 6 respectively show a disassemble state and an assemble state of a flexible printed circuit board having a gold finger with a rigid printed circuit board.

At first, a flexible printed circuit board having gold fingers is provided as shown in step 100, and a rigid printed circuit board is provided as shown in step 102.

In step 104, the flexible printed circuit board having the gold fingers may electrically be connected with the rigid printed circuit board by hot-bar or surface mount technology (SMT). Also, please referring to FIGS. 5 and 6, the second electrical connecting portion 212 of the flexible printed circuit board 10 may electrically connect to a conductive terminal 201 of the rigid printed circuit board 20. The second plated through hole 223 has a function of heat conduction and soldering, and the voids of the flexible printed circuit board 10 can provide a space for overflowing solder and heat dissipation so that the second electrical connecting portion 212 can electrically connect with the conductive terminal 201 securely. In step 106, a semi-product may be formed by electrically connecting the flexible printed circuit board having the gold finger with the rigid printed circuit board.

Please refer to FIG. 6 again. FIG. 6 shows an assemble state of a flexible printed circuit board having a gold finger with a rigid printed circuit board. As shown in FIG. 6, the electrical connection of the flexible printed circuit board 10 having a gold finger to a rigid printed circuit board 20 can largely reduce the cost of manufacture and save much space. For example, when the rigid printed circuit board 20 is used as a printed circuit board for a load like electric fans or mother boards of a system like an electronic device such as a portable computers or a desktop computer, the flexible printed circuit board 10 is used as a transmission interface by plugging the first electrical connecting portion 211 of the flexible printed circuit board 10 to a connector of the system that can not only reduce the cost of manufacture, but also save space. Compared to the traditional electronic device using cable with a thickness of 0.38 mm as a transmission interface, the flexible printed circuit board 10 may save much space because the flexible printed circuit board 10 only has a thickness of 0.20 mm. In addition, the flexible printed circuit board 10 may be suitable for various spaces and has a high precision of shape.

Although specific embodiments have been illustrated and described herein, it will be appreciated by those of ordinary skill in the art that a variety of alternate and/or equivalent implementations can be substituted for the specific embodiments shown and described without departing from the scope of the present disclosure. This application is intended to cover any adaptations or variations of the specific embodiments discussed herein. Therefore, it is intended that this disclosure be limited only by the claims and the equivalents thereof.

What is claimed is:

1. A flexible printed circuit board connecting electrically with a conductive terminal of a rigid printed circuit board and connecting electrically with a terminal of a system, the flexible printed circuit board comprising:

a base sheet having a first surface and a second surface thereon, and the base sheet having a first end and a second end;

a metallic layer comprising a first metallic layer and a second metallic layer shorter than the first metallic layer, wherein the first metallic layer is provided on the first surface or the second surface of the base sheet, and the first metallic layer has a first electrical connecting portion for electrically connecting to the terminal of the system that is provided on the first surface or the second surface at the first end in one end, and the first metallic layer has a second electrical connecting portion for electrically connecting to the conductive terminal of the rigid printed circuit board on the second surface or the first surface at the second end in another end, and the second electrical connecting portion has at least one first plated through hole; and the second metallic layer is provided on the first surface or the second surface of the base sheet at the second end, and the second metallic layer has a third electrical connecting portion and a fourth electrical connecting portion, and the second metallic layer has at least one second plated through hole between the third electrical connecting portion and the fourth electrical connecting portion, and the second plated through hole communicates with the first plated through hole, and the first plated through hole is formed a plating layer on an internal wall, and the second plated through hole is formed a plating layer on an internal wall; and a protective sheet provided on the metallic layer and the base sheet to expose the first electrical connecting portion of the first end, the second electrical connecting portion of the second end, the first plated through hole, the third electrically connecting portion and the second plated through hole.

2. The flexible printed circuit board of claim 1, wherein a width of the second end is greater than or equal to that of the first end.

3. The flexible printed circuit board of claim 2, wherein the base sheet has a meandering shape, straight line shape or curved shape.

4. The flexible printed circuit board of claim 3, wherein the base sheet is a material of polyimide.

5. The flexible printed circuit board of claim 1, wherein the second end has a plurality of voids, and a connecting portion is provided on one side of the voids.

6. The flexible printed circuit board of claim 5, wherein the first metallic layer comprises a plurality of wires, and the second metallic layer comprises a plurality of wires.

7. The flexible printed circuit board of claim 6, wherein the wires of the first metallic layer at the second end are separated by the voids and the wires of the second metallic layer at the second end are separated by the voids.

8. The flexible printed circuit board of claim 7, wherein the first plated through hole and the second plated through hole which are provided on one of the wires are symmetric or asymmetric with the first plated through hole and the second plated through hole which are provided on another adjacent wire.

9. The flexible printed circuit board of claim 8, wherein the metallic layer is a copper foil.

10. The flexible printed circuit board of claim 1, wherein the first plated through hole and the second plated through hole are filled with a solder.

11. The flexible printed circuit board of claim 1, wherein the protective sheet comprises a first protective sheet and a second protective sheet, in which the first protective sheet is provided on the first metallic layer and the base sheet, and the first protective sheet exposes the first electrical connecting portion, the second electrical connecting portion and first plated through hole; and the second protective sheet is provided on the second metallic layer and the base sheet to expose the third electrically connecting portion and the second plated through hole.

12. The flexible printed circuit board of claim 11, wherein the second protective sheet has a plugging sheet at one end to match with the first electrical connecting portion so that the plugging sheet and the first electrical connecting portion can plug to the terminal of the system.

13. The flexible printed circuit board of claim 12, wherein the protective sheet is a material of epoxy.

* * * * *